(12) United States Patent
Kuramoto

(10) Patent No.: US 7,606,278 B2
(45) Date of Patent: Oct. 20, 2009

(54) SEMICONDUCTOR LASER, METHOD OF MANUFACTURING SEMICONDUCTOR DEVICE, OPTICAL PICKUP, AND OPTICAL DISK APPARATUS

(75) Inventor: Masaru Kuramoto, Miyagi (JP)

(73) Assignee: Sony Corporation, Tokyo (JP)

( * ) Notice: Subject to any disclaimer, the term of this patent is extended or adjusted under 35 U.S.C. 154(b) by 361 days.

(21) Appl. No.: 11/741,980

(22) Filed: Apr. 30, 2007

(65) Prior Publication Data

US 2008/0175291 A1    Jul. 24, 2008

(30) Foreign Application Priority Data

May 2, 2006    (JP)    ............................. 2006-128193

(51) Int. Cl.
*H01S 5/00*    (2006.01)
(52) U.S. Cl. ................. 372/45.01; 372/43.01
(58) Field of Classification Search ............ 372/50.124, 372/45.01, 49.01
See application file for complete search history.

(56) References Cited

U.S. PATENT DOCUMENTS

| | | | |
|---|---|---|---|
| 5,073,041 A * | 12/1991 | Rastani ..................... | 385/33 |
| 6,121,634 A | 9/2000 | Saito | |
| 6,735,231 B2 | 5/2004 | Ono | |
| 6,897,484 B2 | 5/2005 | Ohno | |
| 7,120,181 B1 | 10/2006 | Hayashi | |
| 2006/0104327 A1* | 5/2006 | Karnutsch et al. ...... | 372/50.124 |
| 2008/0192791 A1* | 8/2008 | Furukawa et al. ........ | 372/50.12 |
| 2008/0240188 A1* | 10/2008 | Ohmi et al. .............. | 372/43.01 |

FOREIGN PATENT DOCUMENTS

| | | |
|---|---|---|
| JP | 08-228043 | 9/1996 |
| JP | 1997-018093 | 1/1997 |
| JP | 09-191160 | 7/1997 |
| JP | 10-294532 | 11/1998 |
| JP | 2000-183449 | 6/2000 |
| JP | 2001-308461 | 11/2001 |

(Continued)

OTHER PUBLICATIONS

T. Ohno; Self-pulsation in InGaN laser diodes with saturable absorber layers; Applied Physics Letters; vol. 83, No. 6; Aug. 11, 2003.

(Continued)

*Primary Examiner*—Minsun Harvey
*Assistant Examiner*—Tuan N. Nguyen
(74) *Attorney, Agent, or Firm*—Sonnenschein Nath & Rosenthal LLP

(57) ABSTRACT

Disclosed herein is a semiconductor laser including: a first clad layer of a first conduction type; an active layer over said first clad layer; a saturable absorbing layer over said active layer; and a second clad layer of a second conduction type over said saturable absorbing layer; at least said second clad layer being provided with a pair of grooves parallel to each other with a predetermined spacing therebetween so as to form a ridge stripe therebetween. In the semiconductor laser, the distance from bottom surfaces of said grooves to an upper surface of said active layer is not less than 105 nm, and the distance from said bottom surfaces of said grooves to an upper surface of said saturable absorbing layer is not more than 100 nm.

11 Claims, 6 Drawing Sheets

FOREIGN PATENT DOCUMENTS

| | | |
|---|---|---|
| JP | 2002-151786 | 5/2002 |
| JP | 2002-280671 | 9/2002 |
| JP | 2002-319733 | 10/2002 |
| JP | 2003-031898 | 1/2003 |
| JP | 2003-218458 | 7/2003 |
| JP | 3459588 | 8/2003 |
| JP | 2003-309325 | 10/2003 |
| JP | 2004-111820 | 4/2004 |
| JP | 2004-179532 | 6/2004 |
| JP | 2006-066660 | 3/2006 |
| JP | 2002-314197 | 8/2008 |

OTHER PUBLICATIONS

Japanese Office Action dated Jun. 10, 2008 for Application No. 2006-128193.

Japanese Office Action issued on Feb. 26, 2008 in connection with Japanese Patent Application No. 2006-128193.

* cited by examiner

SEMICONDUCTOR LASER, METHOD OF MANUFACTURING SEMICONDUCTOR DEVICE, OPTICAL PICKUP, AND OPTICAL DISK APPARATUS

CROSS REFERENCES TO RELATED APPLICATIONS

The present invention contains subject matter related to Japanese Patent Application JP 2006-128193 filed in the Japan Patent Office on May 2, 2006, the entire contents of which being incorporated herein by reference.

BACKGROUND OF THE INVENTION

1. Field of the Invention

The present invention relates to a semiconductor laser, a method of manufacturing a semiconductor laser, an optical pickup and an optical disk apparatus, and is particularly suitable for application, for example, to a self-pulsation (self-oscillation) type semiconductor laser using a nitride type Group III-V compound semiconductor and to an optical disk using the semiconductor laser as a light source.

2. Description of the Related Art

In a high-density optical disk system, a GaN-based semiconductor laser in a 400 nm wavelength band is used as a light source. In this case, it may be necessary to reduce the return light noise of the GaN-based semiconductor laser. One of the measures to cope with this problem is a technique of causing a self-pulsation operation.

In order to realize such a self-pulsation operation, there has been proposed a method in which a saturable absorbing layer is provided at a light guide layer (guide layer) or a clad layer, and the saturable absorbing layer is doped with an impurity (refer to, for example, Japanese Patent Laid-Open No. Hei 9-191160). In relation to this system, however, it has been pointed out as a problem the instability of the self-pulsation operation against temperature (refer to, for example, Japanese Patent Laid-Open No. 2003-31898). It has also been proposed to enable a self-pulsation operation by selecting the thickness of a saturable absorbing layer, the light confinement coefficient, the distance between an active layer and the saturable absorbing layer, etc. or by inserting a wide-gap semiconductor between the active layer and the saturable absorbing layer (refer to, for example, Japanese Patent Laid-Open No. 2003-31898 and Japanese Patent Laid-Open No. 2003-218458). However, even the use of these conditions may not stably provide a semiconductor laser capable of a self-pulsation operation. For example, it has been reported that mere introduction of a p-type GaN layer between a saturable absorbing layer and a p-type AlGaN layer made the self-pulsation operation hard (refer to, for example, Appl. Phys. Lett., Vol. 83, p. 1098 (2003), herein after referred to as Non-Patent Document 1). Non-Patent Document 1 gives a conclusion that the promotion of recombination of carriers at the interface between the p-type AlGaN layer and the saturable absorbing layer and the tunneling of carriers due to a piezo effect make the carrier lifetime in the saturable absorbing layer shorter on an effective basis, thereby contributing to the self-pulsation operation. In any way, such instability forms a serious problem in the mass production of a GaN-based semiconductor laser designed to perform a self-pulsation operation.

SUMMARY OF THE INVENTION

As has been above-mentioned, it has been difficult to obtain a GaN semiconductor laser capable of a stable self-separation operation.

Thus, there is a need for a semiconductor laser which makes it possible to easily obtain a semiconductor laser using a nitride type Group III-V compound semiconductor capable of a stable self-pulsation operation and having a long life, and for a method of manufacturing a semiconductor laser by which such a semiconductor laser can be manufactured easily.

There is also a need for a semiconductor laser with which it is possible to easily obtain semiconductor lasers using various semiconductors capable of a stable self-pulsation operation and having a long life, and for a method of manufacturing a semiconductor laser by which such semiconductor lasers can be easily manufactured.

Further, there is a need for an optical pickup and an optical disk apparatus which use the above-mentioned semiconductor laser as a light source.

The present inventor made intensive and extensive studies for the purpose of meeting the above needs, and, as a result of the studies, has completed the present invention, as summarized below.

In Non-Patent Document 1, the reason for the instability of the self-pulsation operation lies in the insufficient reduction in the carrier lifetime in the saturable absorbing layer. For meeting the above needs, therefore, it may be necessary to make the carrier lifetime in the saturable absorbing layer shorter on an effective basis. In order to shorten the carrier lifetime, it is important to increase the chance of recombination of carriers. In this relation, the present inventor considered that a positive introduction of damages to the saturable absorbing layer by dry etching might be the most effective and ready means of increasing the chance of recombination of carriers, and, eventually, has found out experimentally the optimum conditions for the introduction of damages. More specifically, the present inventor has found out that, in the case where grooves are formed and hence a ridge stripe is formed therebetween by applying dry etching from the clad layer side for the purpose of controlling the transverse mode in a semiconductor laser having a saturable absorbing layer between an active layer and a clad layer, a structure in which the distance from the bottom surfaces of the grooves to the upper surface of the active layer is not less than 105 nm and the distance from the bottom surfaces of the grooves to the upper surface of the saturable absorbing layer is not more than 100 nm, maximizes the mean time to failure (MTTF) and thereby makes it possible to realize a semiconductor laser capable of a stable self-pulsation operation and having a long time.

According to one embodiment of the present invention, there is provided a semiconductor laser including: a first clad layer of a first conduction type; an active layer over the first clad layer; a saturable absorbing layer over the active layer; and a second clad layer of a second conduction type over the saturable absorbing layer; at least the second clad layer being provided with a pair of grooves parallel to each other with a predetermined spacing therebetween so as to form a ridge stripe therebetween, wherein the distance from bottom surfaces of the grooves to an upper surface of the active layer is not less than 105 nm, and the distance from the bottom surfaces of the grooves to an upper surface of the saturable absorbing layer is not more than 100 nm.

According to another embodiment of the present invention, there is provided a method of manufacturing a semiconductor laser having: a first clad layer of a first conduction type; an active layer over the first clad layer; a saturable absorbing layer over the active layer; and a second clad layer of a second conduction type over the saturable absorbing layer; at least the second clad layer being provided with a pair of grooves parallel to each other with a predetermined spacing therebetween so as to form a ridge stripe therebetween, the method including the steps of growing the first clad layer, the active layer, the saturable absorbing layer and the second clad layer, and thereafter applying dry etching to at least the second clad layer to form the grooves so that the distance from bottom surfaces of the grooves to an upper surface of the active layer is not less than 105 nm and that the distance from the bottom surfaces of the grooves to an upper surface of the saturable absorbing layer is not more than 100 nm.

According to a further embodiment of the present invention, there is provided an optical pickup using a semiconductor laser as a light source, wherein the semiconductor laser includes: a first clad layer of a first conduction type; an active layer over the first clad layer; a saturable absorbing layer over the active layer; and a second clad layer of a second conduction type over the saturable absorbing layer; at least the second clad layer being provided with a pair of grooves parallel to each other with a predetermined spacing therebetween so as to form a ridge stripe therebetween, the distance from bottom surfaces of the grooves to an upper surface of the active layer is not less than 105 nm, and the distance from the bottom surfaces of the grooves to an upper surface of the saturable absorbing layer is not more than 100 nm.

According to yet another embodiment of the present invention, there is provided an optical disk apparatus using a semiconductor laser as a light source, wherein the semiconductor laser includes: a first clad layer of a first conduction type; an active layer over the first clad layer; a saturable absorbing layer over the active layer; and a second clad layer of a second conduction type over the saturable absorbing layer; at least the second clad layer being provided with a pair of grooves parallel to each other with a predetermined spacing therebetween so as to form a ridge stripe therebetween, the distance from bottom surfaces of the grooves to an upper surface of the active layer is not less than 105 nm, and the distance from the bottom surfaces of the grooves to an upper surface of the saturable absorbing layer is not more than 100 nm.

In the above-mentioned four embodiments of the present invention, the distance from the bottom surfaces of the grooves to the upper surface of the active layer and the distance from the bottom surfaces of the grooves to the upper surface of the saturable absorbing layer are distances in a coordinate system wherein a point in the bottom surfaces of the grooves is taken as an origin and the direction from the origin toward the active layer is taken as the positive direction. While the distance from the bottom surfaces of the grooves to the upper surface of the saturable absorbing layer is not more than 100 nm, this distance is not necessarily be positive or 0 (the distance is in the range of 0 to 100 nm) but may be negative. The case where the distance is negative includes the case where the bottom surfaces of the grooves are located between the upper surface and the lower surface of the saturable absorbing layer (inclusive of the case where the bottom surfaces of the grooves are located on the plane of the lower surface of the saturable absorbing layer) and the case where the bottom surfaces of the grooves are located to be deeper than the lower surface of the saturable absorbing layer and shallower than the upper surface of the active layer.

Typically, the saturable absorbing layer is damaged in the vicinity of the bottom surfaces and/or side surfaces of the grooves. The cause of the damage is not particularly limited; typically, however, the damage is an etching damage generated when the grooves are formed by dry etching of at least the second clad layer. Where the distance from the bottom surfaces of the grooves to the upper surface of the saturable absorbing layer is in the range of 100 to 0 nm, the damage to the saturable absorbing layer is generated in the vicinity of the bottom surfaces of the grooves. In the case where the distance from the bottom surfaces of the grooves to the upper surface of the saturable absorbing layer is smaller than 0 nm, in other words, in the case where the bottom surfaces of the grooves are located between the upper surface and the lower surface of the saturable absorbing layer or where the bottom surfaces of the grooves are located to be deeper than the lower surface of the saturable absorbing layer and shallower than the upper surface of the active layer, the damage to the saturable absorbing layer is generated in the vicinity of the bottom surfaces and side surface lower portions of the grooves or in the vicinity of side surfaces of the grooves.

The saturable absorbing layer may be doped with an impurity (generally, doped in a high impurity concentration), if necessary, whereby non-emission recombination centers are formed.

The adjacent ones of the first clad layer, the active layer, the saturable absorbing layer and the second clad layer may be in direct contact with each other, or one or more layers with some other functions may be interposed between them. For example, a first light guide layer may be provided between the first clad layer and the active layer, and a second light guide layer may be provided between the second clad layer and the active layer. Meanwhile, in order to shorten the carrier lifetime, it is important not only to increase the chance of recombination of carriers but also to restrain the injection into the active layer of other carriers than the carriers generated upon light absorption. For this purpose, a barrier layer for preventing the carriers injected from the first clad layer side into the active layer from migrating beyond the active layer to the second clad layer side may be provided between the active layer and the second clad layer. Specifically, this barrier layer is so provided, for example, as to have a two-layer structure including an undoped layer and a p-type layer with such compositions as to provide a sufficient barrier height between the active layer and the saturable absorbing layer. In this case, the undoped layer is provided on the active layer side, and the p-type layer is provided on the saturable absorbing layer side. In a semiconductor laser using a nitride type Group III-V compound semiconductor, for example, such undoped layer and p-type layer can be easily obtained by changing the Al composition or In composition of AlGaN, AlGaInN or the like. It is preferable that $E_{g1}<E_{g2}$, where $E_{g1}$ is the band gap energy of the undoped layer and $E_{g2}$ is the band gap energy of the p-type layer.

Preferably, an insulating film is formed on the side surfaces of the ridge stripe, in the inside of the grooves, and on the layers in the areas on the outer sides of the grooves. The insulating film may be basically formed of any substance that has electrically insulating properties or has a sufficiently high resistance. From the viewpoint of reducing the electrostatic capacity of the semiconductor laser, however, a substance having a low permittivity (dielectric constant) is preferable for use as the material of the insulating film. In addition, the insulating film may have a monolayer structure or a multilayer structure. In the case where the insulating film has a two-layer structure, it is preferable that the upper layer is so formed as to have a higher absorption coefficient for rays of the oscillation wavelength; for example, where the wavelength of laser light is in the violet waveband, the upper layer is preferably an undoped Si film, and the lower layer is $SiO_2$ film, for example.

The first clad layer, the active layer, the saturable absorbing layer and the second clad layer, typically, are provided in this order over a substrate by epitaxial growth. The substrate may be a conductive substrate, particularly a conductive semiconductor substrate, or an insulating substrate such as a sapphire substrate. The semiconductor laser, typically, is one that uses a nitride type Group III-V compound semiconductor, but is not limited to this. Namely, the semiconductor laser may be one that uses other kind of semiconductor (inclusive of ZnO or other oxide semiconductors) insofar as it is a semiconductor laser having a structure similar to that of the semiconductor laser according the above-mentioned one embodiment of the present invention. The nitride type Group III-V compound semiconductor includes most generally $Al_xB_yGa_{1-x-y-z}In_zAs_uN_{1-u-v}P_v$, where $0 \leq x \leq 1$, $0 \leq y \leq 1$, $0 \leq z \leq 1$, $0 \leq u \leq 1$, $0 \leq v \leq 1$, $0 \leq x+y+z < 1$, and $0 \leq u+v < 1$, specifically $Al_xB_yGa_{1-x-y-z}In_zN$, where $0 \leq x \leq 1$, $0 \leq y \leq 1$, $0 \leq z \leq 1$, and $0 \leq x+y+z < 1$, and typically $Al_xGa_{1-x-z}In_zN$, where $0 \leq x \leq 1$, and $0 \leq z \leq 1$. Specific examples of the semiconductor include GaN, InN, AlN, AlGaN, InGaN, and AlGaInN. The substrate in this case can be a conductive substrate, particularly a nitride type Group III-V compound semiconductor substrate, and most typically a GaN substrate. Where a conductive semiconductor substrate is used, typically, an electrode on the first conduction type side is formed on the back surface of the substrate. An electrode on the second conduction type side is typically formed on a contact layer which is provided on the second clad layer. In the case where the electrode on the first conduction type side is formed on the back surface of the conductive semiconductor substrate and where the electrode on the second conduction type side is formed on the contact layer on the second clad layer in the state of extending to the outer sides of the grooves, it is preferable that the insulating film formed on the side surfaces of the ridge stripe, in the inside of the grooves and on the contact layer in the areas on the outer sides of the grooves has a sufficiently large thickness in the areas on the outer sides of the grooves. This configuration ensures that the spacing between the electrode on the first conduction type side and the electrode on the second conduction type side, in the areas on the outer sides of the grooves, can be set larger than those in the area of the ridge stripe and in the areas of the grooves. As a result, it is possible to reduce the electrostatic capacity between the electrodes, to enhance the high-frequency characteristics of the semiconductor laser, and to prevent electrostatic leakage or electrostatic breakdown from occurring. Examples of the method for growing the nitride type Group III-V compound semiconductor include various epitaxial growth processes such as metallo-organic chemical vapor deposition (MOCVD), hydride vapor phase epitaxy or halide vapor phase epitaxy (HVPE), and molecular beam epitaxy (MBE).

The optical disk apparatus includes those used exclusively for reproduction (reading), those used exclusively for recording (writing), and those capable of both reproduction and recording. The reproduction and/or recording system is not particularly limited. The optical pickup is one that is suited to use in such an optical apparatus.

In the first to fourth embodiments of the present invention which are configured as above, generally, the distance from the bottom surfaces of the grooves formed on both sides of the ridge stripe by dry etching to the upper surface of the active layer is not less than 105 nm, and the distance from the bottom surfaces of the grooves to the upper surface of the saturable absorbing layer is not more than 100 nm. This general configuration ensures that damage to the saturable absorbing layer can be generated in the vicinity of the bottom surfaces and/or side surfaces of the grooves and the carrier lifetime can be thereby shortened sufficiently, without deteriorating the active layer.

According to an embodiment of the present invention, the carrier lifetime in the saturable absorbing layer in the vicinity of the bottom surfaces and/or side surfaces of the grooves can be reduced sufficiently, whereby it is possible to easily obtain semiconductor lasers using various semiconductors such as nitride type Group III-V compound semiconductors which are capable of a stable self-pulsation operation and have a long life. Besides, by using such a semiconductor laser as a light source, a high-performance optical disk apparatus can be realized.

DETAILED DESCRIPTION OF THE PREFERRED EMBODIMENTS

Figure 1:
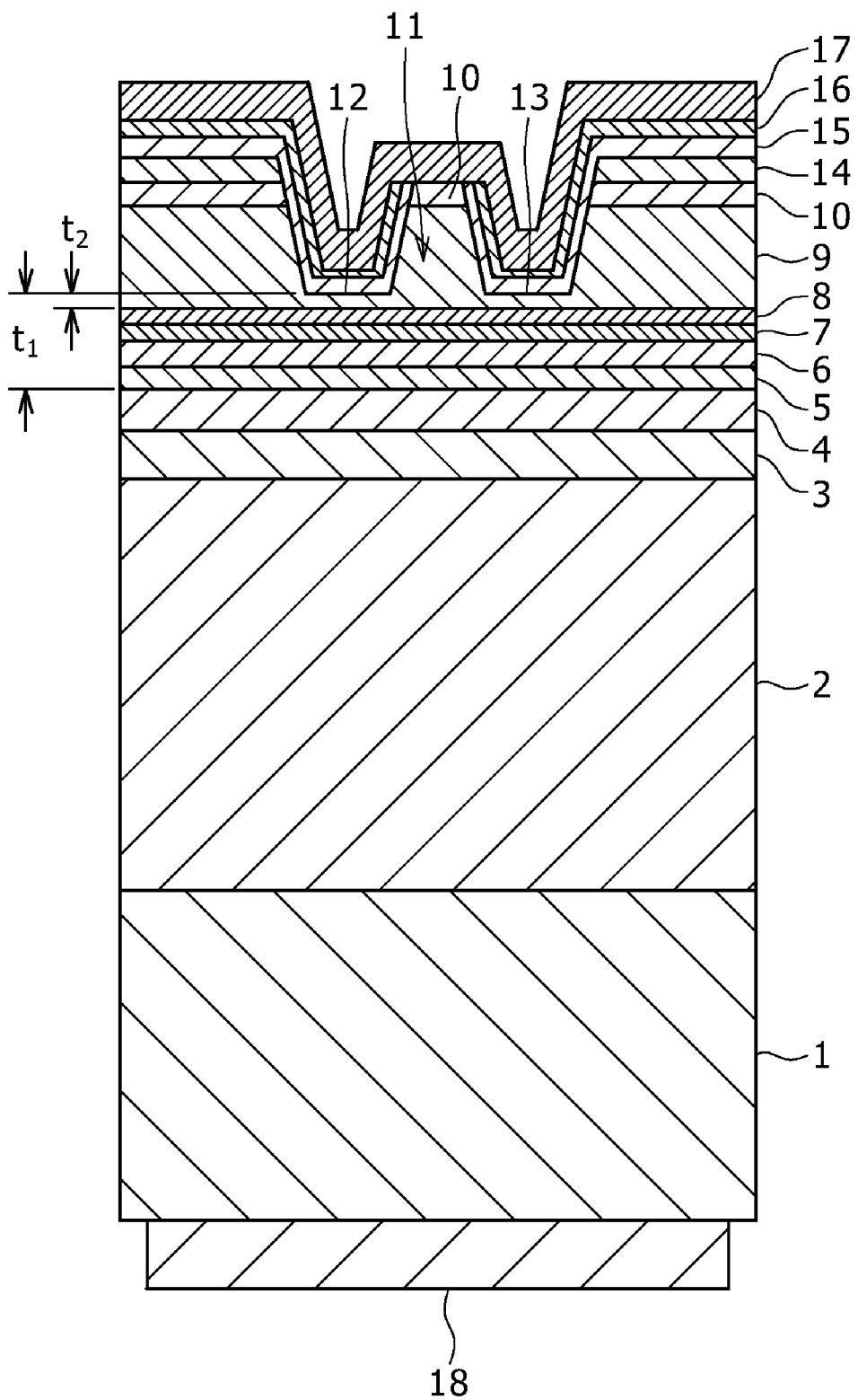
FIG. 1 is a sectional view showing a GaN-based semiconductor laser according to a first embodiment of the present invention.

Now, some embodiments of the present invention will be described below, referring to the drawings. In all the drawings relating to the embodiments, the same or corresponding parts are denoted by the same symbols.

FIG. 1 shows a self-pulsation type GaN-based semiconductor laser according to a first embodiment of the present invention.

As shown in FIG. 1, in the GaN-based semiconductor laser, an n-type AlGaN clad layer 2, an n-type GaN light guide layer 3, an active layer 4 having an undoped $Ga_{1-x}In_xN$ (quantum well layer)/$Ga_{1-y}In_yN$ (barrier layer, x>y) multiple quantum well structure, an undoped InGaN light guide layer 5, an undoped AlGaN light guide layer 6, a p-type AlGaN electron barrier layer 7, a saturable absorbing layer 8 having a p-type InGaN layer sandwiched between p-type GaN layers, a p-type GaN/undoped AlGaN superlattice clad layer 9, and a p-type GaN contact layer 10 are sequentially layered over an n-type GaN substrate 1. The n-type AlGaN clad layer 2 and the n-type GaN light guide layer 3 are doped with an n-type impurity, for example, Si. On the other hand, the p-type AlGaN electron barrier layer 7, the p-type GaN layers and the p-type InGaN layers constituting the saturable absorbing layer 8, and the p-type GaN layer constituting the p-type GaN/undoped AlGaN superlattice clad layer 9, and the p-type GaN contact layer 10, are doped with a p-type impurity, for example, Mg. The p-type GaN/undoped AlGaN superlattice clad layer 9 and the p-type GaN contact layer 10 are provided with a ridge stripe 11 extending rectilinearly in one direction. Grooves 12 and 13 are formed respectively on both sides of the ridge stripe 11. An insulating film 14 such as an $SiO_2$ film is formed on the p-type GaN contact layer 10 in the areas on the outer sides of the grooves 12 and 13. In addition, an $SiO_2$ film 15 and an undoped Si film 16 thereon are formed on the side surfaces of the ridge stripe 11, in the grooves 12 and 13, and on the p-type GaN contact layer 10 in the areas on the outer sides of the grooves 12 and 13. A p-side electrode 17 is formed in electrical contact with the p-type GaN contact layer 10 of the ridge stripe 11. The p-side electrode 17 is formed to extend onto the p-type GaN contact layer 10 in the areas on the outer sides of the grooves 12 and 13. On the other hand, an n-side electrode 18 is formed in electrical contact with the back surface of the n-type GaN substrate 1.

The depth of the grooves 12 and 13 is so set as to satisfy $t_1 \geq 105$ nm and $0 \leq t_2 \leq 100$ nm, where $t_1$ is the distance from the bottom surfaces of the grooves 12 and 13 to the upper surface of the active layer 4, in a coordinate system in which a point on the bottom surfaces of the grooves 12 and 13 is taken as an origin and the direction from the origin toward the active layer 4 is taken as the positive direction, and $t_2$ is the distance from the bottom surfaces of the grooves 12 and 13 to the upper surface of the saturable absorbing layer 8. The reason for this configuration will be described later. Generally, $t_1 < 0.6$ μm, and typically $t_1 < 200$ nm. The width of each of the grooves 12 and 13 is generally not more than 250 μm, more generally not more than 100 μm, and typically not more than 20 μm.

Now, a method of manufacturing this GaN-based semiconductor laser will be described below.

First, the n-type AlGaN clad layer 2, the n-type GaN light guide layer 3, the active layer 4, the undoped InGaN light guide layer 5, the undoped AlGaN light guide layer 6, the p-type AlGaN electron barrier layer 7, the saturable absorbing layer 8, the p-type GaN/undoped AlGaN superlattice clad layer 9, and the p-type GaN contact layer 10 are sequentially epitaxially grown over the n-type GaN substrate 1 by, for example, a metallo-organic chemical vapor deposition (MOCVD). Here, the n-type AlGaN clad layer 2, the n-type GaN light guide layer 3, the undoped AlGaN light guide layer 6, the p-type AlGaN electron barrier layer 7, the saturable absorbing layer 8, the p-type GaN/undoped AlGaN superlattice clad layer 9 and the p-type GaN contact layer 10, which do not contain In, are grown at temperatures of about 1,000° C., whereas the active layer 4 having the undoped $Ga_{1-x}In_xN/Ga_{1-y}In_yN$ multiple quantum well structure and the undoped InGaN light guide layer 5, which are In-containing layers, are grown at temperatures of, for example, 700 to 800° C., specifically, for example, 730° C., these temperatures being non-limitative examples.

As for raw materials for growing these GaN-based semiconductor layers, for example, triethylgallium (($C_2H_5)_3$Ga, TRG) or trimethylgallium (($CH_3)_3$Ga, TMG) is used as material for Ga, trimethylaluminum (($CH_3)_3$Al, TMA) is used as material for Al, triethylindium (($C_2H_5)_3$In, TEI) or trimethylindium (($CH_3)_3$In, TMI) is used as material for In, and ammonium ($NH_3$) is used as material for N. As for dopants, for example, silane ($SiH_4$) is used as an n-type dopant, whereas bis(methylcyclopentadienyl)magnesium (($CH_3C_5H_4)_2$Mg), bis(ethylcyclopentadienyl)magnesium (($C_2H_5C_5H_4)_2$Mg) or bis(cyclopentadienyl)magnesium (($C_5H_5)_2$Mg) is used as a p-type dopant, these materials being non-limitative examples. Besides, for example, $H_2$ gas is used as a carrier gas atmosphere at the time of growing the above-mentioned GaN-based semiconductor layers, the $H_2$ gas being a non-limitative example.

Next, an insulating film 14 such as an $SiO_2$ film is formed over the whole surface, and thereafter the insulating film 14 is patterned into a predetermined shape by etching. Subsequently, the p-type GaN contact layer 10 and the p-type GaN/undoped AlGaN superlattice clad layer 9 are etched by dry etching, such as reactive ion etching (RIE), using the patterned insulating film 14 as an etching mask, to form the grooves 12 and 13, thereby forming the ridge stripe 11. Then, while the insulating film 14 used as the etching mask is left as it is, the $SiO_2$ film 15 and the undoped Si film 16, for example, are sequentially formed over the whole surface, and thereafter these films (15, 16) over the ridge stripe 11 are selectively etched away, thereby exposing the upper surface of the ridge stripe 11. Subsequently, the p-side electrode 17 is formed on the undoped Si film 16. Next, if necessary, the n-type GaN substrate 1 is polished from the back side thereof, to thin the n-type GaN substrate 1 to a predetermined thickness. Then, the n-side electrode 18 is formed on the back surface of the n-type GaN substrate 1.

By these steps, the GaN-based semiconductor laser shown in FIG. 1 is produced.

Specific examples of the thicknesses, compositions and the like of the GaN-based semiconductor layers constituting the laser structure will be given below. The n-type AlGaN clad layer 2 has a thickness of 1.3 μm and an Al composition of 0.07. The n-type GaN light guide layer 3 has a thickness of 0.1 μm. The active layer 4 has a structure in which the $Ga_{1-x}In_xN$ layer constituting the quantum well layer has a thickness of 3 nm and an In composition x of 0.08, and the $Ga_{1-y}In_yN$ layer constituting the barrier layer has a thickness of 7 nm and an In composition y of 0.02, the number of wells being three. The undoped InGaN light guide layer 5 has a thickness of 40 nm and an In composition of 0.02. The undoped AlGaN light guide layer 6 has a thickness of 60 nm and an Al composition of 0.02. The p-type AlGaN electron barrier layer 7 has a thickness of 10 nm and Al composition of 0.20. The saturable absorbing layer 8 has a structure in which a p-type $In_{0.02}Ga_{0.98}$ layer with a thickness of 2 nm is sandwiched between p-type GaN layers each having a thickness of 3 nm. These p-type layers constituting the saturable absorbing layer 8 are each doped with Mg in a concentration of, for example, $5 \times 10^{18}$ to $1 \times 10^{20}$ cm$^{-3}$. The p-type GaN/undoped AlGaN superlattice clad layer 9 has a thickness of 0.5 μm, and its undoped AlGaN layer has an Al composition of 0.10. The p-type GaN contact layer 10 has a thickness of 0.1 μm. The ridge stripe 11 has a width of 1.5 to 2 μm, for example.

In this GaN-based semiconductor laser, by the dry etching conducted for forming the grooves 12 and 13 in order to shorten the carrier lifetime in the saturable absorbing layer 8, an etching damage is positively introduced to the saturable absorbing layer 8 including the p-type InGaN layer which is doped with Mg. In this case, for assured introduction of the etching damage to the saturable absorbing layer 8, the above-mentioned condition of $0 \leq t_2 \leq 100$ nm is established. In the saturable absorbing layer 8 with the etching damage introduced thereto, an increased number of intermediate levels are formed, and the non-emission recombination process through the intermediate levels is increased, whereby the non-emission recombination lifetime is shortened. In general, the carrier lifetime $\tau_s$ can be represented by the following formula, using the emission recombination lifetime $\tau_r$ and the non-emission recombination lifetime $\tau_{nr}$.

$$1/\tau_s = 1/\tau_r + 1/\tau_{nr}$$

From the formula it is understood that when the non-emission recombination lifetime $\tau_{rn}$ becomes shorter, the carrier lifetime $\tau_s$ also becomes shorter.

Figure 2:
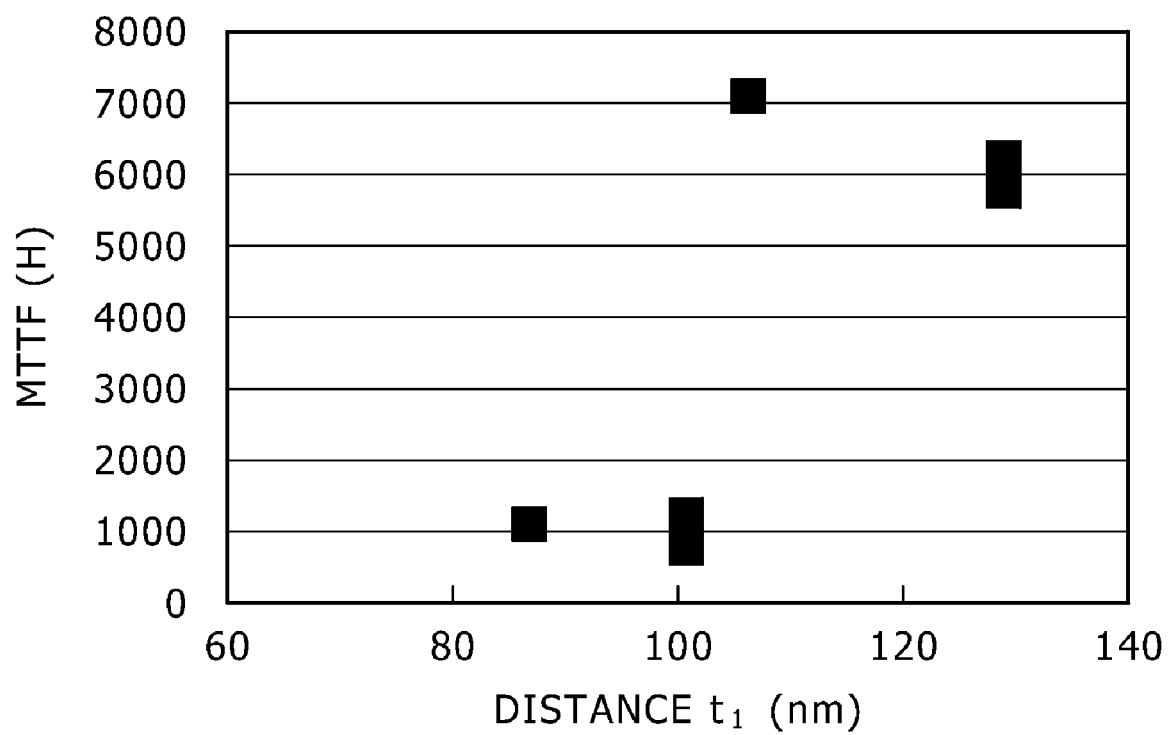
FIG. 2 is a diagram showing the measurement results of the relationship between the distance $t_1$ from the bottom surfaces of grooves to the upper surface of the active layer and MTTH, in the GaN-based semiconductor laser according to the first embodiment of the present invention.

FIG. 2 shows the measurement results of the relationship between the distance $t_1$ and the MTTF (mean time to failure) of the GaN-based semiconductor laser. It is to be noted here that the thicknesses, compositions and the like of the GaN-based semiconductor layers constituting the laser structure in the GaN-based semiconductor laser are the same as in the specific example mentioned above. It is seen from FIG. 2 that the MTTF is short when $t_1 \leq 100$ nm. This arises from the fact that in a GaN-based semiconductor laser satisfying the condition of $t_1 \leq 100$ nm, an etching damage is introduced to the active layer 4 at the time of the dry etching conducted for forming the grooves 12 and 13, with the result of rapid worsening of the life. Therefore, the carrier lifetime in the saturable absorbing layer 8 is shortened by setting the distance $t_2$ from the bottom surfaces, i.e., the dry-etched surfaces, of the grooves 12 and 13 to the upper surface of the saturable absorbing layer 8 in the range of $t_2 \leq 100$ nm, and, at the same time, the MTTF of the GaN-based semiconductor laser is sufficiently secured by establishing the condition of $t_1 \geq 105$ nm.

Besides, in this GaN-based semiconductor laser, the two layers including the undoped AlGaN light guide layer 6 which has, for example, a thickness of 60 nm and an Al composition of 0.02 and the p-type AlGaN electron barrier layer 7 which has, for example, a thickness of 10 nm and an Al composition of 0.20 are provided between the saturable absorbing layer 8 and the active layer 4, for the purpose of suppressing the leakage from the active layer 4 of the electrons having been injected into the active layer 4 from the n-type AlGaN clad layer 2 side. Here, the undoped AlGaN light guide layer 6, due to its state of being undoped, flattens the energy band in the vicinity of the active layer 4, thereby effectively enlarging the carrier barrier energy as viewed from the electrons leaking from the active layer 4, notwithstanding the lowered Al composition; thus, the undoped AlGaN light guide layer 6 functions to block the electrons leaking from the active layer 4. Furthermore, the p-type AlGaN electron barrier layer 7 plays the role of blocking the electrons having migrated beyond the undoped AlGaN light guide layer 6. In this manner, the electron blocking layer is formed in two stages by the presence of the undoped AlGaN light guide layer 6 and the p-type AlGaN electron barrier layer 7, whereby the carrier overflow from the active layer 4 can be suppressed effectively, and the number of electrons injected into the saturable absorbing layer 8 due to the overflow can be reduced remarkably. As a result, the carrier lifetime in the saturable absorbing layer 8 can be shortened on an effective basis. The GaN-based semiconductor laser configured in this way is high in reliability and is capable of performing a stable self-pulsation operation.

Figure 3:
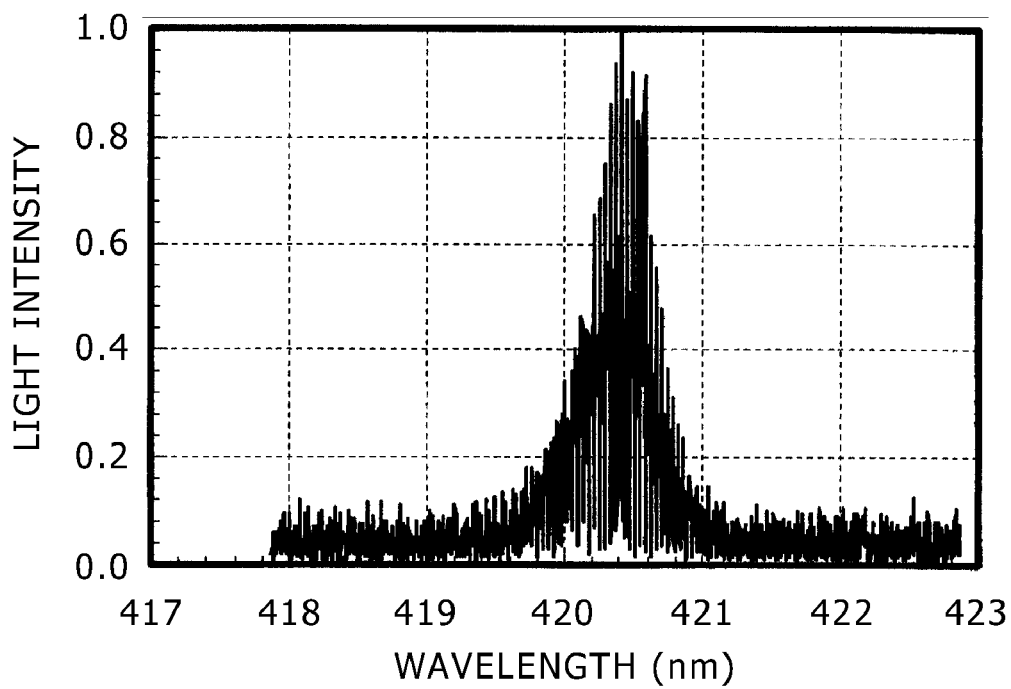
FIG. 3 is a diagram showing the measurement results of spectral characteristics of the GaN-based semiconductor laser according to the first embodiment of the present invention.
Figure 4:
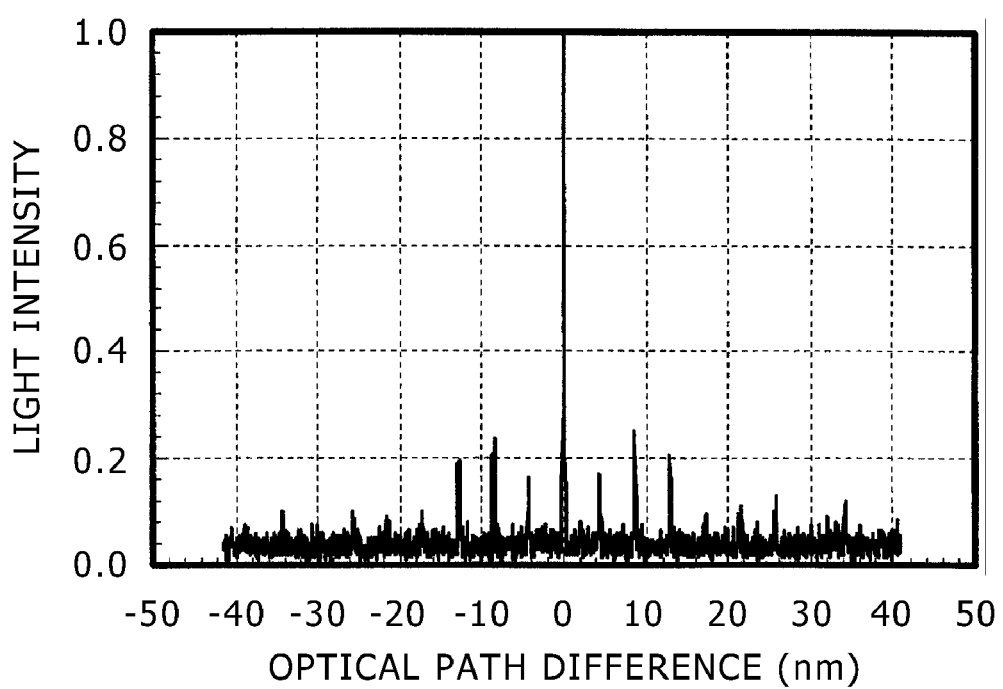
FIG. 4 is a diagram showing the measurement results of coherent characteristic of the GaN-based semiconductor laser according to the first embodiment of the present invention.

FIGS. 3 and 4 show the measurement results of spectral characteristics and coherent characteristic of this GaN-based semiconductor laser. It is to be noted here that the thicknesses, compositions and the like of the GaN-based semiconductor layers forming the laser structure in the GaN-based semiconductor served to the measurement are the same as in the specific example mentioned above, with $t_1 = 145$ nm and $t_2 = 13$ nm. In addition, the measurement of the coherent characteristic was carried out with a light output of 15 mW. Besides, $\gamma = 20\%$. As is clear from FIG. 3, a multi-mode oscillation characteristic of a self-pulsation laser is confirmed. In addition, as shown in FIG. 4, a coherent lowering ($\gamma$ characteristic), which is also characteristic of a self-pulsation laser, is confirmed.

Figure 5:
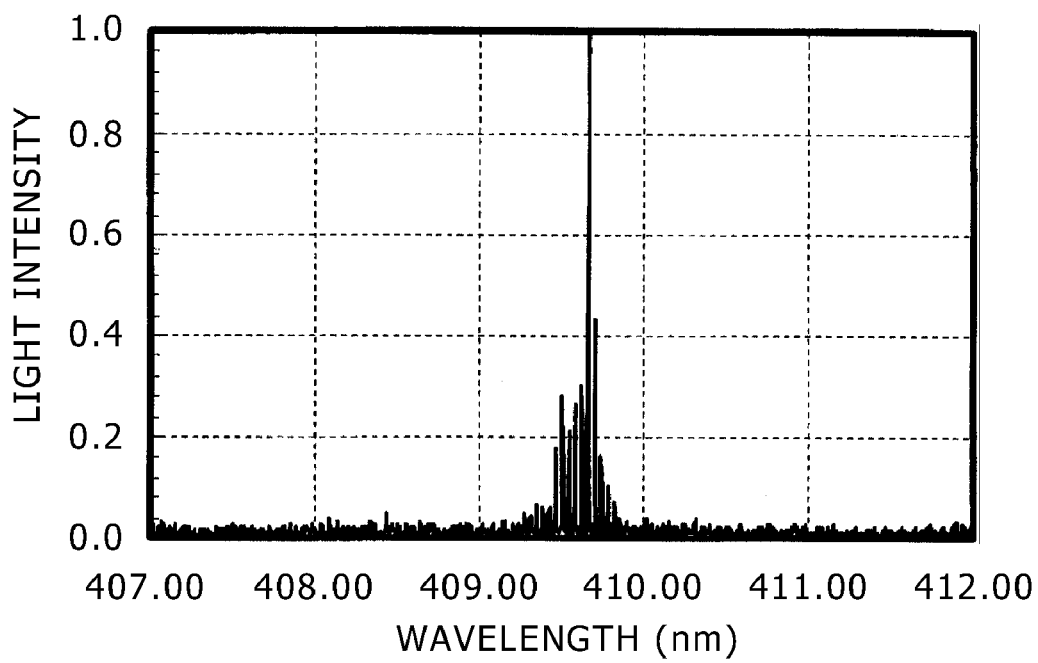
FIG. 5 is a diagram showing the measurement results of spectral characteristics of a GaN-based semiconductor laser according to a comparative example.
Figure 6:
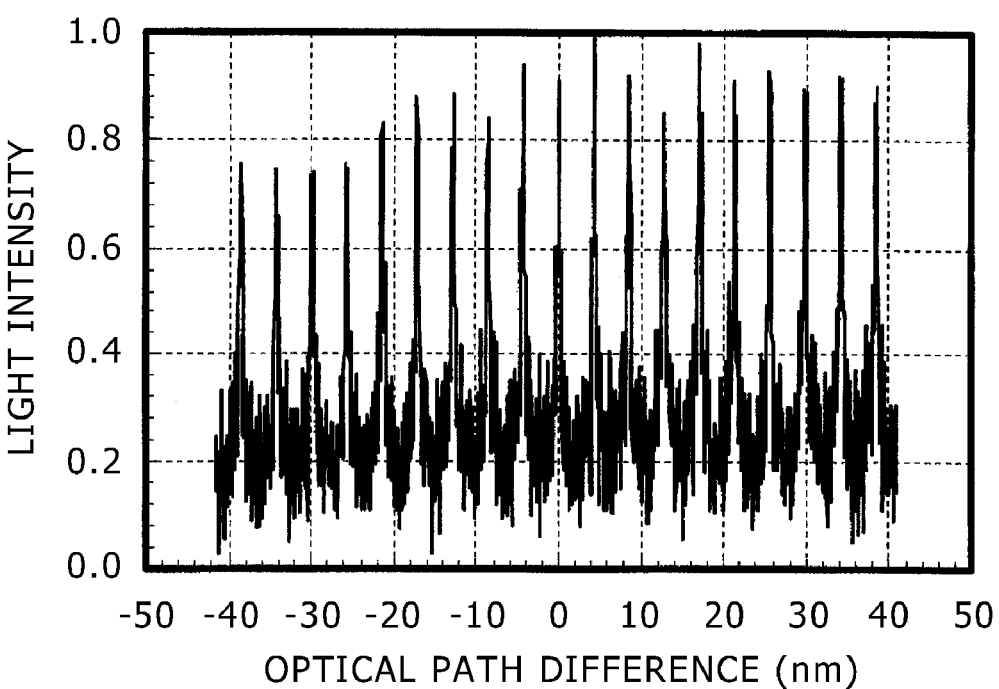
FIG. 6 is a diagram showing the measurement results of coherent characteristic of a GaN-based semiconductor laser according to the comparative example.

FIGS. 5 and 6 show the measurement results of spectral characteristics and coherent characteristic of a GaN-based semiconductor laser according to a comparative example. The thicknesses, compositions and the like of GaN-based semiconductor layers forming the laser structure in the GaN-based semiconductor laser of the comparative example are the same as in the above-mentioned specific example of the present invention, but adopts the settings of $t_1 = 145$ nm and $t_2 = 102$ nm; thus, $t_1$ satisfies the condition of $t_1 \geq 105$ nm but $t_2$ does not satisfy the condition of $0 \leq t_2 \leq 100$ nm. The measurement of the coherent characteristic was carried out with a light output of 15 mW. As is clear from FIG. 5, a multi-mode oscillation is confirmed, which indicates a self-pulsation operation. However, the coherent lowering ($\gamma$ characteristic) was insufficient, as is clear from FIG. 6.

As has been described above, according to the first embodiment of the present invention, it is possible to easily realize a GaN-based semiconductor laser capable of a stable self-pulsation operation, high in reliability and having a long life.

In addition, the following advantages can be obtained. Since the insulating film 14, the $SiO_2$ film 15 and the undoped Si film 16 are formed over the p-type GaN contact layer 10 in the areas on the outer sides of the grooves 12 and 13, the spacing between the p-side electrode 17 and the n-side electrode 18 in the areas on the outer sides of the grooves 12 and 13 can be set to be greater than that in the areas of the ridge stripe 11 and the grooves 12 and 13, by the total thickness of the insulating film 14, the $SiO_2$ film 15 and the undoped Si film 16. This makes it possible to reduce the electrostatic capacity between the p-side electrode 17 and the n-side electrode 18, to enhance the high-frequency characteristics of the GaN-based semiconductor laser, and to prevent electrostatic leakage or electrostatic breakdown from occurring.

The self-pulsation type GaN-based semiconductor laser is suited, for example, to use as a light source of an optical pickup in an optical disk apparatus.

Now, a GaN-based semiconductor laser according to a second embodiment of the present invention will be described below.

Figure 7:
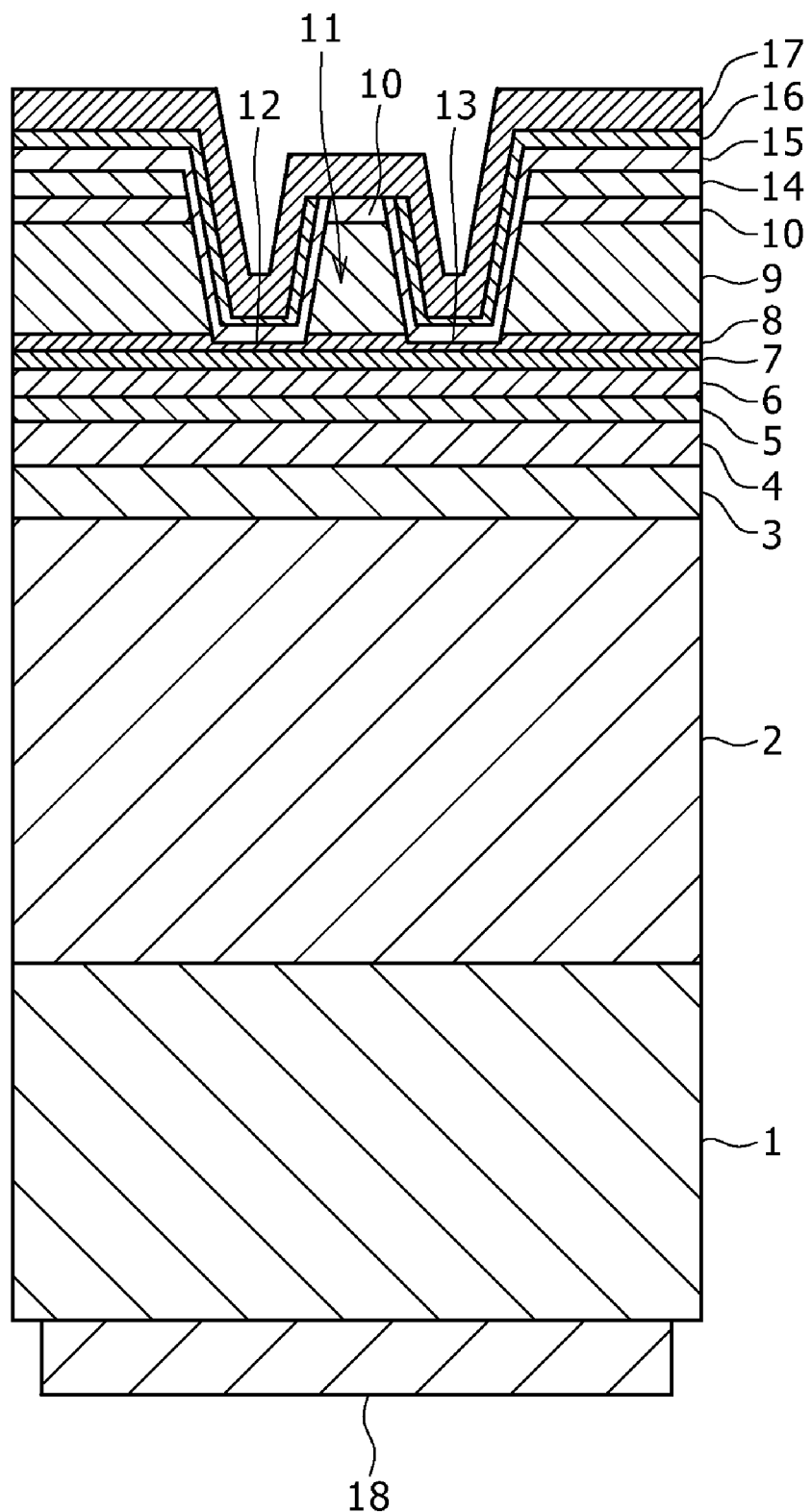
FIG. 7 is a sectional view showing a GaN-based semiconductor laser according to a second embodiment of the present invention.

As shown in FIG. 7, this GaN-based semiconductor laser is configured in the same manner as the GaN-based semiconductor laser according to the first embodiment, except that the bottom surfaces of the grooves 12 and 13 are located between the upper surface and the lower surface of the saturable absorbing layer 8. In this case, etching damage to the saturable absorbing layer 8 is generated in the vicinity of the bottom surfaces and the side surface lower portions of the grooves 12 and 13.

According to the second embodiment, the same advantages as those of the first embodiment can be obtained.

Now, a GaN-based semiconductor laser according to a third embodiment of the present invention will be described below.

Figure 8:
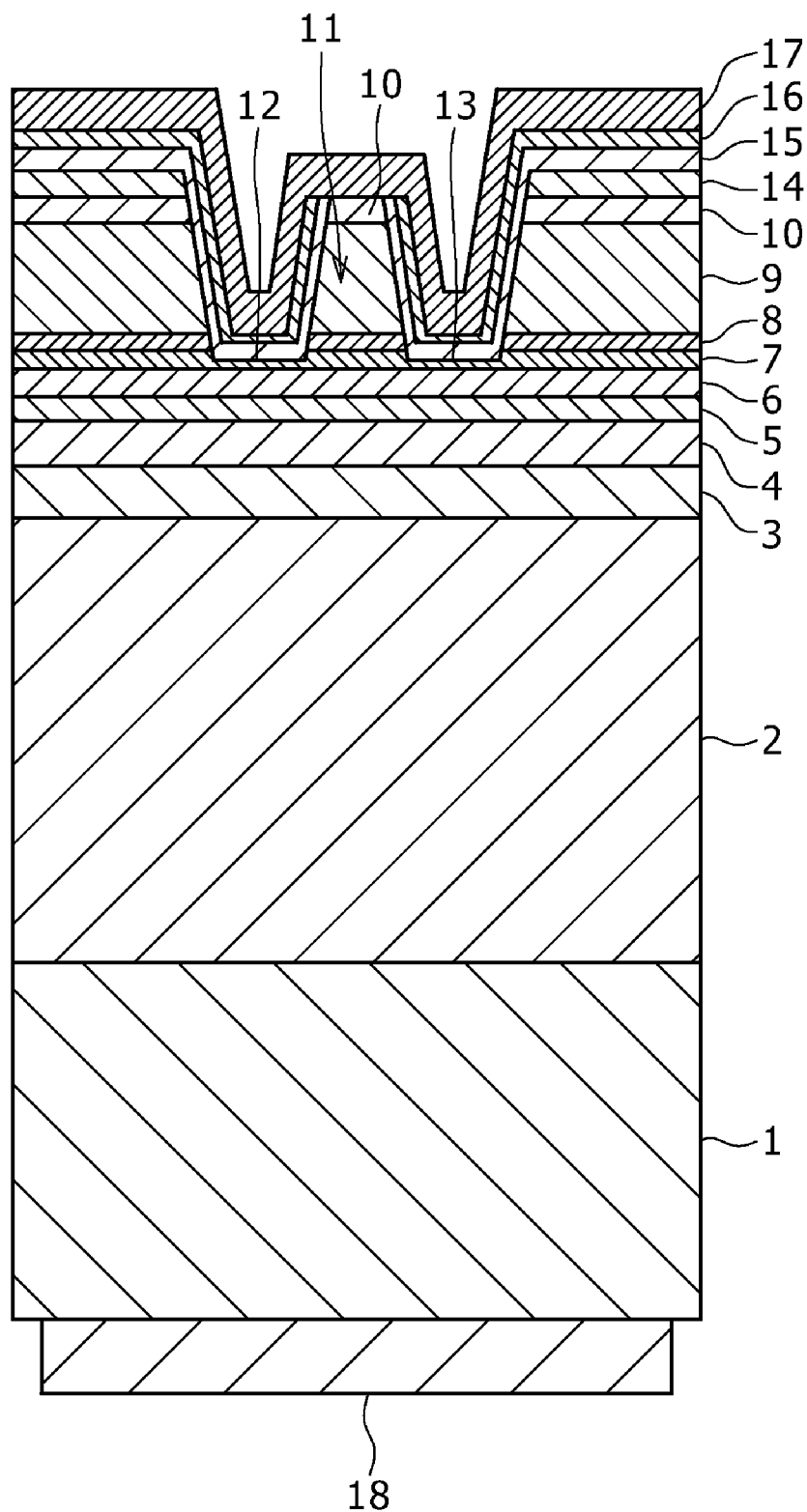
FIG. 8 is a sectional view showing a GaN-based semiconductor laser according to a third embodiment of the present invention.

As shown in FIG. 8, this GaN-based semiconductor laser is configured in the same manner as the GaN-based semiconductor laser according to the first embodiment, except that the bottom surfaces of the grooves 12 and 13 are located below the lower surface of the saturable absorbing layer 8. In this case, edge damage to the saturable absorbing layer 8 is generated in the vicinity of side surfaces of the grooves 12 and 13.

According to the third embodiment, the same advantages as those of the first embodiment can be obtained.

While some embodiments of the present invention have been specifically described above, the invention is not to be construed as limited to the embodiments, and various modifications are possible based on the technical thought of the invention.

For example, the numerical values, structures, substrates, processes, etc. mentioned in the description of the embodiments above are mere examples, and other numerical values, structures, substrates, processes, etc. than the above-mentioned may be used, as occasion demands.

Incidentally, a sufficient reduction of the carrier lifetime in the saturable absorbing layer 8 can be realized also by a method in which the distant $t_2$ from the bottom surfaces of the grooves 12 and 13 to the upper surface of the saturable absorbing layer 8 is so selected that $t_2 > 105$ nm, and ion implantation is applied to the grooves 12 and 13, whereby a damage comparable to the etching damage due to the dry etching, for example, is introduced to the saturable absorbing layer 8 on the lower side of the bottom surfaces of the grooves 12 and 13.

What is claimed is:

1. A semiconductor laser comprising:
   a first clad layer of a first conduction type;
   an active layer over said first clad layer;
   a saturable absorbing layer over said active layer; and
   a second clad layer of a second conduction type over said saturable absorbing layer;
   at least said second clad layer being provided with a pair of grooves parallel to each other with a predetermined spacing therebetween so as to form a ridge stripe therebetween,
   wherein the distance from bottom surfaces of said grooves to an upper surface of said active layer is not less than 105 nm, and the distance from said bottom surfaces of said grooves to an upper surface of said saturable absorbing layer is not more than 100 nm.

2. The semiconductor laser as set forth in claim 1, wherein said bottom surfaces of said grooves are located between said upper surface and a lower surface of said saturable absorbing layer.

3. The semiconductor laser as set forth in claim 1, wherein said bottom surfaces of said grooves are located to be deeper than a lower surface of said saturable absorbing layer and shallower than said upper surface of said active layer.

4. The semiconductor laser as set forth in claim 1, wherein said saturable absorbing layer is damaged in the vicinity of said bottom surfaces and/or side surfaces of said grooves.

5. The semiconductor laser as set forth in claim 1, wherein said grooves are formed by dry etching of at least said second clad layer.

6. The semiconductor laser as set forth in claim 1, wherein said saturable absorbing layer is doped with an impurity.

7. The semiconductor laser as set forth in claim 1, which uses a nitride type Group III-V compound semiconductor.

8. The semiconductor laser as set forth in claim 1, wherein said first clad layer, said active layer, said saturable layer and said second clad layer are provided in this order over a substrate.

9. A method of manufacturing a semiconductor laser having:
   a first clad layer of a first conduction type;
   an active layer over said first clad layer;
   a saturable absorbing layer over said active layer; and
   a second clad layer of a second conduction type over said saturable absorbing layer;
   at least said second clad layer being provided with a pair of grooves parallel to each other with a predetermined spacing therebetween so as to form a ridge stripe therebetween,
   said method comprising the steps of growing said first clad layer, said active layer, said saturable absorbing layer and said second clad layer, and thereafter applying dry etching to at least said second clad layer to form said grooves so that the distance from bottom surfaces of said grooves to an upper surface of said active layer is not less than 105 nm and that the distance from said bottom surfaces of said grooves to an upper surface of said saturable absorbing layer is not more than 100 nm.

10. An optical pickup using a semiconductor laser as a light source,
    wherein said semiconductor laser includes:
    a first clad layer of a first conduction type;
    an active layer over said first clad layer;
    a saturable absorbing layer over said active layer; and
    a second clad layer of a second conduction type over said saturable absorbing layer;
    at least said second clad layer being provided with a pair of grooves parallel to each other with a predetermined spacing therebetween so as to form a ridge stripe therebetween,
    the distance from bottom surfaces of said grooves to an upper surface of said active layer is not less than 105 nm, and the distance from said bottom surfaces of said grooves to an upper surface of said saturable absorbing layer is not more than 100 nm.

11. An optical disk apparatus using a semiconductor laser as a light source,
    wherein said semiconductor laser includes:
    a first clad layer of a first conduction type;
    an active layer over said first clad layer;
    a saturable absorbing layer over said active layer; and
    a second clad layer of a second conduction type over said saturable absorbing layer;
    at least said second clad layer being provided with a pair of grooves parallel to each other with a predetermined spacing therebetween so as to form a ridge stripe therebetween,
    the distance from bottom surfaces of said grooves to an upper surface of said active layer is not less than 105 nm, and the distance from said bottom surfaces of said grooves to an upper surface of said saturable absorbing layer is not more than 100 nm.

* * * * *